United States Patent
Lin

(10) Patent No.: US 12,249,958 B2
(45) Date of Patent: Mar. 11, 2025

(54) INTEGRATED LC OSCILLATOR OF COMPACT LAYOUT AND LOW PHASE NOISE AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 9 days.

(21) Appl. No.: 18/341,854

(22) Filed: Jun. 27, 2023

(65) Prior Publication Data

US 2025/0007458 A1    Jan. 2, 2025

(51) Int. Cl.
 *H03B 5/12* (2006.01)
(52) U.S. Cl.
 CPC ..... *H03B 5/1212* (2013.01); *H03B 2200/009* (2013.01)
(58) Field of Classification Search
 CPC .......... H03B 5/1212; H03B 2200/009
 USPC .................................................... 331/117 FE
 See application file for complete search history.

(56) References Cited

U.S. PATENT DOCUMENTS

| | | | |
|---|---|---|---|
| 9,490,745 B1 * | 11/2016 | Toso | H03B 5/1228 |
| 11,075,603 B1 | 7/2021 | Lin | |
| 11,271,525 B2 * | 3/2022 | Chen | H03B 5/1215 |

* cited by examiner

*Primary Examiner* — Richard Tan
(74) *Attorney, Agent, or Firm* — McClure, Qualey & Rodack, LLP

(57) ABSTRACT

An method of integrating an oscillator includes incorporating a main inductor and a main capacitor for establishing an oscillation; incorporating two cross-coupling NMOST and two cross-coupling PMOST for sustaining the oscillation; incorporating a first auxiliary inductor and a first auxiliary capacitor for suppressing a noise of the two cross-coupling NMOST; incorporating a second auxiliary inductor and a second auxiliary capacitor for suppressing a noise of the two cross-coupling PMOST; laying out the main inductor symmetrically with respect to a plane of symmetry; laying out the first auxiliary inductor as a parallel connection of two halves that are inside the main inductor and symmetrical with respect to the plane of symmetry; and laying out the second auxiliary inductor as a parallel connection of two halves that are inside the main inductor in a close proximity to the first auxiliary inductor and symmetrical with respect to the plane of symmetry.

16 Claims, 4 Drawing Sheets

INTEGRATED LC OSCILLATOR OF COMPACT LAYOUT AND LOW PHASE NOISE AND METHOD THEREOF

BACKGROUND OF THE DISCLOSURE

Field of the Disclosure

The present disclosure generally relates to LC oscillator and particularly to LC oscillator of compact layout and low phase noise.

Description of Related Art

As depicted in FIG. 1, an LC (which stands for inductor-capacitor) oscillator 100 comprises a LC tank 110, a first cross-coupling pair 120, a second cross-coupling pair 140, a first source degeneration network 130, and a second source degeneration network 150. The LC tank 110 comprises inductor 111 and capacitor 112 configured to resonate at a resonant frequency $f_0$. The first cross-coupling pair 120 comprises a first NMOST (n-channel metal-oxide semiconductor transistors) 121 and a second NMOST 122 configured in a cross-coupling topology. The second cross-coupling pair 140 comprises a first PMOST (p-channel metal-oxide semiconductor transistors) 141 and a second PMOST 142 configured in a cross-coupling topology. The first source degeneration network 130 comprises inductor 131 and capacitor 132 configured to resonate and provide a high impedance at $2 \times f_0$, which is twice of the resonant frequency of the LC tank 100. The second source degeneration network 150 comprises inductor 151 and capacitor 152 configured to resonate and provide a high impedance at $2 \times f_0$.

Throughout this disclosure, "$V_{DD}$" denotes a power supply node and "$V_{SS}$" denotes a ground node. The LC tank 110 establishes an oscillation of an oscillation frequency approximately equal to the resonant frequency $f_0$. The first cross-coupling pair 120 and the second cross-coupling pair 140 both are regenerative networks that provide a regeneration function to compensate an Ohmic loss of the LC tank 110 and thus sustain the oscillation. The first source degeneration network 130 is configured to provide a source degeneration of the first cross-coupling pair 120 by forming a high impedance at $2 \times f_0$ to suppress a phase noise of the oscillation that results from an up-conversion of a noise of the first cross-coupling pair 120. The second source degeneration network 150 is configured to provide a source degeneration of the second cross-coupling pair 124 by forming a high impedance at $2 \times f_0$ to suppress a phase noise of the oscillation that results from an up-conversion of a noise of the second cross-coupling pair 140. LC oscillator 100 is well known in the prior art and thus not further explained.

A scenario of interest is that the LC oscillator 100 is integrated on a silicon substrate using a CMOS (complementary metal-oxide semiconductor) process. It is desired that the LC oscillator 110 is compact in layout and has a low phase noise. However, when the layout is compact, inductors 111, 131, and 151 will inevitably have strong magnetic coupling, causing degradation to quality factors of the LC tank 110, the first source degeneration network 130, and the second source degeneration network 150, resulting in a worse phase noise.

What is desired is an integrated LC oscillator that is compact in layout but has a low phase noise by preserving a quality factor of inductors thereof.

BRIEF DESCRIPTION OF THIS DISCLOSURE

An objective of this present invention is to have a LC (inductor-capacitor) oscillator of a compact layout. This objective is fulfilled by laying out a first auxiliary (that suppresses phase noise) and a second auxiliary inductor (that suppresses phase noise) inside a main inductor (that establishes oscillation).

Another objective of this present invention is to have a LC (inductor-capacitor) oscillator of a low phase noise despite a compact layout. This objective is fulfilled by splitting an auxiliary inductor (that suppresses noise) into two symmetrical halves so that a net magnetic coupling between a main inductor (that establishes oscillation) and the auxiliary inductor is substantially canceled, thus mitigating a quality factor degradation of the main inductor. This objective is further secured by laying a first auxiliary inductor (that suppresses noise) and a second auxiliary inductor (that suppresses noise) in a highly close proximity so that a qualify factor of the first auxiliary inductor and the second auxiliary inductor and consequently an effectiveness of noise suppression is enhanced.

In an embodiment, an integrated oscillator comprises: a LC (inductor-capacitor) tank comprising a parallel connection of a main inductor and a main capacitor placed across a first drain node and a second drain node, the main inductor being laid out symmetrically with respect to a plane of symmetry; a first cross-coupling pair comprising a first NMOST (n-channel metal-oxide semiconductor transistor) and a second NMOST connected to a first source node and configured to cross couple the first drain node and the second drain node; a second cross-coupling pair comprising a first PMOST (p-channel metal oxide semiconductor transistor) and a second PMOST connected to a second source node and configured to cross couple the first drain node and the second drain node; a first source degeneration network comprising a parallel connection of a first auxiliary capacitor and a first auxiliary inductor placed across the first source node and a ground node, the first auxiliary inductor comprising two halves that are mirror images to one another with respect to the plane of symmetry and laid out inside the main inductor; and a second source degeneration network comprising a parallel connection of a second auxiliary capacitor and a second auxiliary inductor placed across the second source node and a power supply node, the second auxiliary inductor comprising two halves that are mirror images to one another with respect to the plane of symmetry and laid out inside the main inductor in a close proximity to the first auxiliary inductor so as to have a strong mutual coupling.

In an embodiment, a method of integrating an oscillator comprises: incorporating a main inductor and a main capacitor for establishing an oscillation; incorporating two cross-coupling NMOST (n-channel metal-oxide semiconductor transistors) and two cross-coupling PMOST (p-channel metal-oxide semiconductor transistors) for sustaining the oscillation; incorporating a first auxiliary inductor and a first auxiliary capacitor for suppressing a noise of the two cross-coupling NMOST; incorporating a second auxiliary inductor and a second auxiliary capacitor for suppressing a noise of the two cross-coupling PMOST; laying out the main inductor symmetrically with respect to a plane of symmetry; laying out the first auxiliary inductor as a parallel connection of two halves that are inside the main inductor and symmetrical with respect to the plane of symmetry; and laying out the second auxiliary inductor as a parallel connection of two halves that are inside the main inductor in a close proximity to the first auxiliary inductor and symmetrical with respect to the plane of symmetry.

DETAILED DESCRIPTION OF THIS DISCLOSURE

Figure 1:
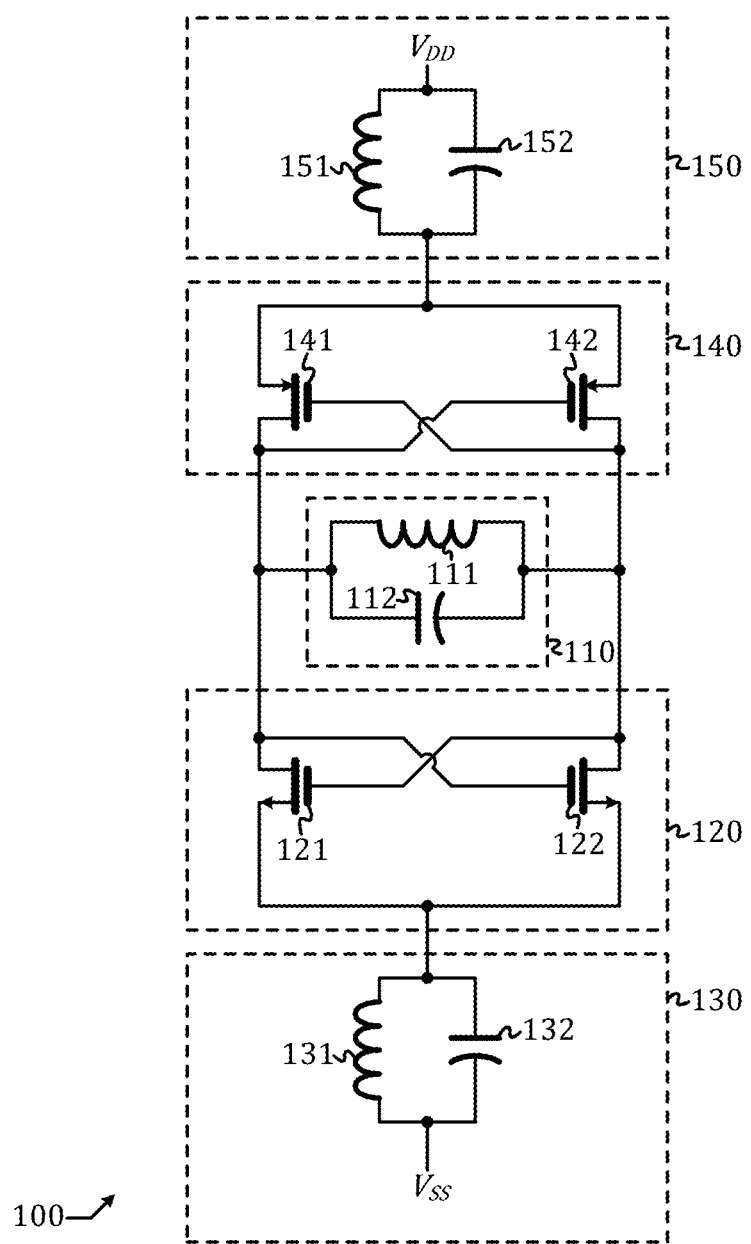
FIG. 1 shows a schematic diagram of a LC oscillator.

The present disclosure is directed to LC oscillator. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "oscillator," "LC oscillator," "frequency," "resonance," "resonant network," "LC tank," "impedance," "power supply," "ground," "noise," "phase noise," "CMOS (complementary metal oxide semiconductor)," "NMOST (n-channel metal-oxide semiconductor transistor)," "PMOST (p-channel metal-oxide semiconductor transistor)," "inductor," "capacitor," "via," and "cross couple." Terms like these are used in a context of microelectronics, and the associated concepts are apparent to those of ordinary skill in the art and thus will not be explained in detail here.

Those of ordinary skill in the art can recognize a capacitor symbol, an inductor symbol, a mutual inductive coupling symbol, and can recognize a MOS (n-channel metal-oxide semiconductor) transistor symbol, and identify the "source," the "gate," and the "drain" terminals thereof, for both PMOST and NMOST. Those of ordinary skill in the art can read schematics of a circuit comprising components such as capacitors, inductors, MOS transistors, and so on, and do not need a verbose description about how one component connects with another in the schematics.

This present disclosure is disclosed from an engineering perspective. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

A power supply node is a circuit node of a voltage that is approximately equal to a power supply voltage that is higher than zero but might have a small high-frequency fluctuation. A ground node is a circuit node of a voltage that is approximately zero but might have a small high-frequency fluctuation. Throughout this disclosure, "$V_{DD}$" denotes a power supply node and "$V_{SS}$" denotes a ground node.

As is known, a circuit is a collection of a transistor, a resistor, an inductor, a capacitor, and/or other electronic devices inter-connected in a certain manner to embody a certain function.

An inductor comprises an electrical conduction path, usually embodied by a metal wire (or trace) that allows a current to flow through and excite a magnetic field. An inductor is often embodied by a metal wire (or trace) configured in a loop topology with two open ends including a first end and a second end, wherein a current can flow from the first end to the second end.

A CMOS process technology allows integrating a plurality of transistors, capacitors, and inductors that are laid out in a multi-layer structure and inter-connected using metal traces and inter-metal-layer vias. An objective of this present disclosure is to integrate a LC oscillator using a CMOS process technology with a compact layout area while achieving a low phase noise. A multi-layer structure of a CMOS technology comprises a polysilicon layer, multiple metal layers including a UTM (ultra-thick metal) layer, a RDL (re-distribution layer), and a plurality of lower metal layers, and a plurality of via layers configured to provide inter-metal connection. By way of example but not limitation, a 28 nm 1P7M (comprising one poly-silicon layer, one UTM layer, six lower metal layers, and a RDL in the multi-layer structure) CMOS technology is used.

Figure 2A:
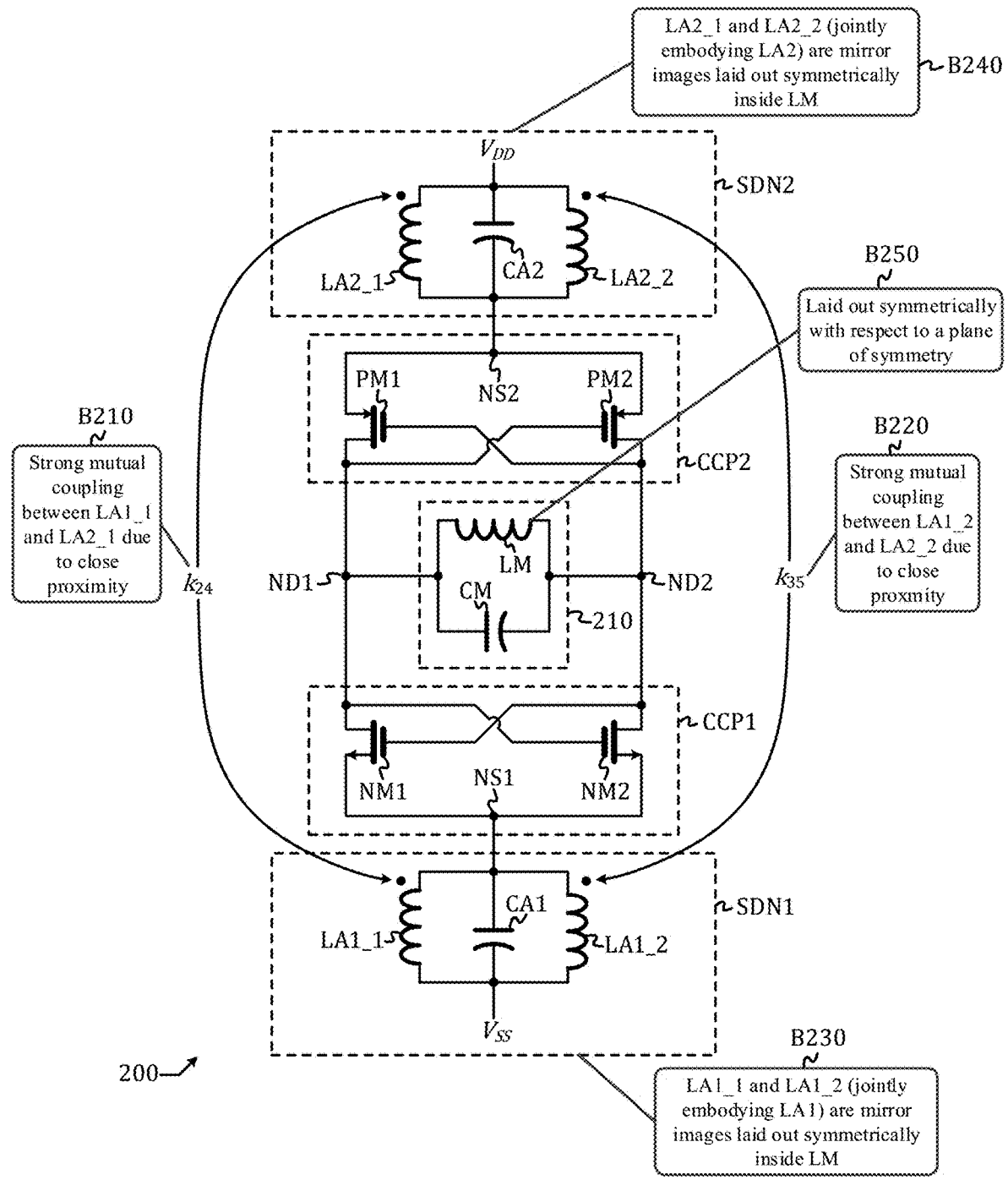
FIG. 2A shows a schematic diagram of an integrated LC oscillator in accordance with an embodiment of the present disclosure.

A schematic diagram of a LC oscillator 200 in accordance with an embodiment of the present invention is depicted in FIG. 2A. By way of example but not limitation, LC oscillator 200 is integrated and fabricated on a silicon substrate using a 28 nm 1P7M CMOS technology. LC oscillator 200 comprises: a LC tank 210 comprising a parallel connection of a main inductor LM and a main capacitor CM placed across a first drain node ND1 and a second drain node ND2; a first cross-coupling pair CCP1 comprising a first NMOST NM1 and a second NMOST NM2 connected to a first source node NS1 and configured to cross couple the first drain node ND1 and the second drain node ND2; a second cross-coupling pair CCP2 comprising a first PMOST PM1 and a second PMOST PM2 connected to a second source node NS2 and configured to cross couple the first drain node ND1 and the second drain node ND2; a first source degeneration network SDN1 comprising a parallel connection of a first auxiliary capacitor CA1 and a first auxiliary inductor LA1 that is split into a first half LA1_1 and a second half LA1_2 placed across the first source node NS1 and a ground node $V_{SS}$; and a second source degeneration network SDN2 comprising a parallel connection of a second auxiliary capacitor CA2 and a second auxiliary inductor LA2 that is split into a first half LA2_1 and a second half LA2_2 placed across the second source node NS2 and a power supply node $V_{DD}$.

The LC tank 210 is configured to form a resonant network of a resonant frequency $f_0$ to establish an oscillation of an oscillation frequency approximately equal to $f_0$. The first cross-coupling pair CCP1 and the second cross-coupling pair CCP2 are both regenerative networks used to compensate an Ohmic loss of the LC tank 210 and thus sustain the oscillation. The first source degeneration network SDN1 is configured to form a resonance and thus provide a high impedance at twice of the oscillation frequency, which is approximately $2 \times f_0$, to suppress an up-conversion of a noise of the first cross-coupling pair CCP1. The second source degeneration network SDN2 is configured to form a resonance and thus provide a high impedance at twice of the oscillation frequency, which is approximately $2 \times f_0$, to suppress an up-conversion of a noise of the second cross-coupling pair CCP2. Functionally, LC oscillator 200 is the same as the LC oscillator 100 of FIG. 1, only that inductor 131 of FIG. 1 is replaced by the first auxiliary inductor LA1 embodied by the parallel connection of LA1_1 and LA1_2, while inductor 151 of FIG. 1 is replaced by the second auxiliary inductor LA2 embodied by the parallel connection of LA2_1 and LA2_2.

However, LC oscillator differs in the following aspects: LA1_1 and LA2_1 are laid out in a highly close proximity so that there is a strong mutual coupling $k_{24}$ between LA1_1 and LA2_1 (see callout box B210), inductors LA1_2 and LA2_2 are laid out in a highly close proximity so that there is strong mutual coupling $k_{35}$ between LA1_2 and LA2_2 (see callout box B220), and therefore there is a strong mutual coupling between the first auxiliary inductor LA1 and the second auxiliary inductor LA2; the first auxiliary inductor LA1 (comprising LA1_1 and LA1_2) is laid out symmetrically inside the main inductor LM (see callout box B230); and the second auxiliary inductor LA2 (comprising LA2_1 and LA2_2) is also laid out symmetrically inside the main inductor LM (see callout box B240), wherein the main inductor LM is laid out symmetrically with respect to a plane of symmetry (see callout box B250). By laying out LA1 and LA2 inside LM, the layout area can be very compact. By taking advantage of the strong mutual coupling between the first auxiliary inductor LA1 (comprising LA1_1 and LA1_2) and the second auxiliary inductor LA2 (comprising LA2_1 and LA2_2) due to the highly close proximity in layout that leads to a strong enhancement of magnetic flux linkage, one can boost a quality factor of LA1 and LA2 and consequently an effectiveness of source degeneration and phase noise suppression of SDN1 and SDN2.

In addition, since LA1_1 and LA1_2 are laid out inside LM in a symmetrical manner with respect to LM, a magnetic coupling between LM and LA1_1 can be canceled by a magnetic coupling between LM and LA1_2, thus suppressing an overall coupling between the LC tank 210 and the first source degeneration network SDN1. Likewise, LA2_1 and LA2_2 are laid out inside LM in a symmetrical manner with respect to LM, so that a magnetic coupling between LM and LA2_1 can be canceled by a magnetic coupling between LM and LA2_2, thus suppressing an overall coupling between the LC tank 210 and the second source degeneration network SDN2. This helps to mitigate an adverse effect of quality factor degradation of LC tank 210 due to an undesired coupling between the LC tank 210 and the two source degeneration networks SDN1 and SDN2. As a result, two objectives can be reached: compact layout area and low phase noise.

Figure 2B:
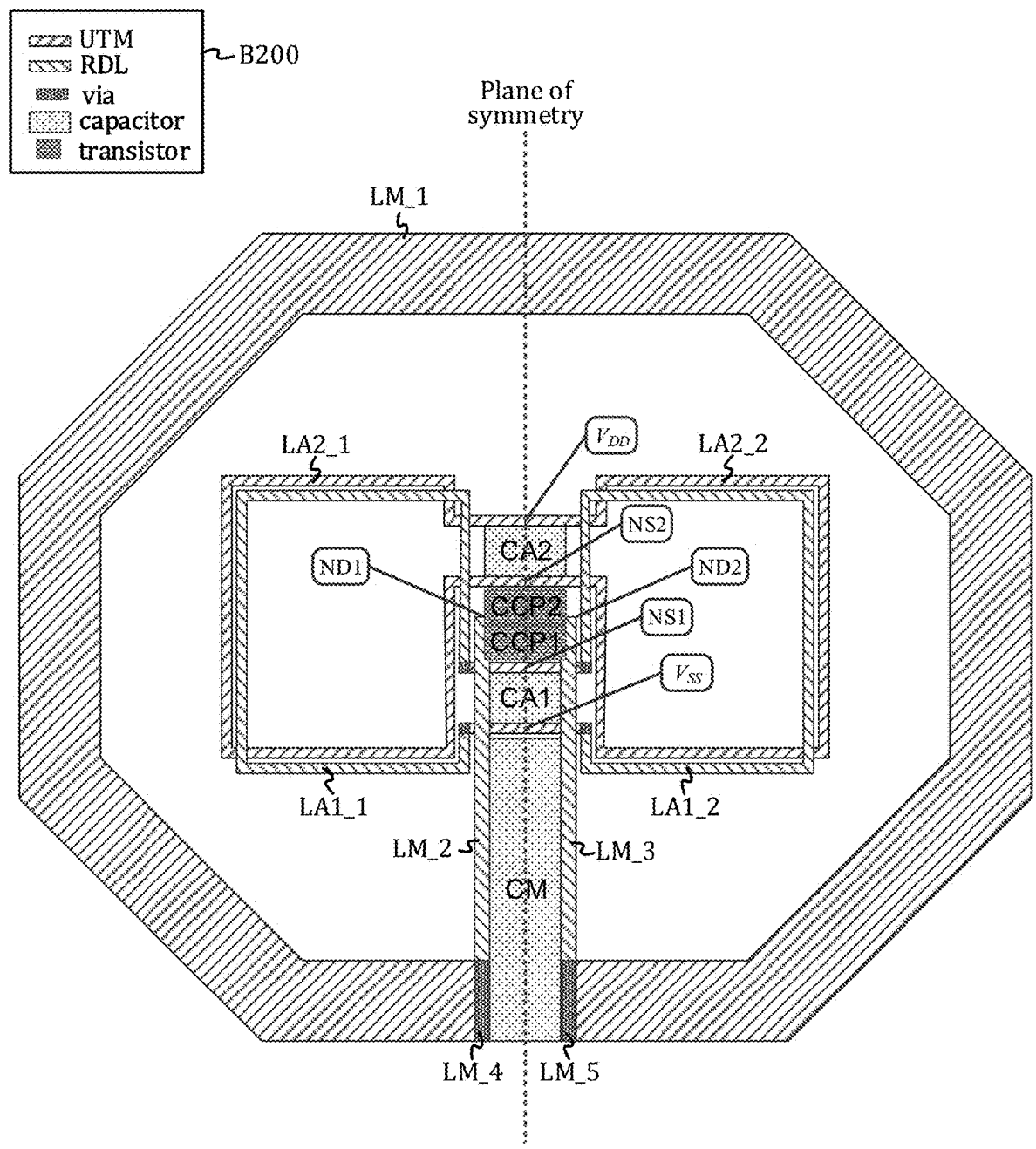
FIG. 2B shows a top view of a layout of the integrated LC oscillator of FIG. 2A.

A top view of a layout of LC oscillator 200, by way of example but not limitation, is shown in FIG. 2B. A legend is shown inside box B200. The main inductor LM comprises a first metal trace LM_1 laid out on the UTM layer, a second metal trace LM_2 and a third metal trace LM_3 laid out on the RDL, along with two inter-metal connection vias LM_4 and LM_5 configured to connect LM_1 to LM_4 and LM_5, respectively. LM_1 is the main part of the main inductor LM, LM_2 and LM_3 are two ends of the main inductor LM that connect to the main capacitor CM, the first coupling pair CCP1, and the second cross coupling pair CCP2. Note that LM_2 and LM_3 electrically embody the first drain node ND1 and the second drain node ND2, respectively. The first auxiliary inductor LA1 (that is split into two halves LA1_1 and LA1_2 connected in parallel) is laid out on the RDL. The second auxiliary inductor LA2 (that is split into two halves LA2_1 and LA2_2 connected in parallel) is laid out on the UTM layer. LM is laid out symmetrical with respect to a plane of symmetry (which in the top view appears to be a central line). LA1_1 and LA1_2 are mirror images to one another with respect to the plane of symmetry. Likewise, LA2_1 and LA2_2 are mirror images to one another with respect to the plane of symmetry. LA1_1 and LA2_1 are laid out in highly close proximity. Likewise, LA1_2 and LA2_2 are also laid out in very close proximity.

The main capacitor CM is laid symmetrically between LM_2 and LM_3 across the plane of symmetry. The first auxiliary capacitor CA1 is laid symmetrically between LA1_1 and LA1_2 across the plane of symmetry. When a current flows from the power supply node $V_{DD}$ to the second source node NS2 through LA2_1 in a counterclockwise direction, there will always be another current of the same magnitude flows from the power supply node $V_{DD}$ to the second source node NS2 through LA2_2 in a clockwise direction due to the geometrical symmetry. A magnetic coupling between LM and LA2_1 will be the same as a magnetic coupling between LM and LA2_2 in magnitude but opposite in polarity; as a result, a net magnetic coupling between the main LM and the second auxiliary inductor LA2 (comprising LA2_1 and LA2_2) is zero, indicating a perfect isolation. Likewise, when a current flows from the first source node NS1 to the ground node $V_{SS}$ through LA1_1 in a counterclockwise direction, there will always be another current of the same magnitude flows from the first source node NS1 to the ground node $V_{SS}$ through LA1_2 in a clockwise direction due to the geometrical symmetry. A magnetic coupling between LM and LA1_1 will be the same as a magnetic coupling between LM and LA1_2 in magnitude but opposite in polarity; as a result, a net magnetic coupling between LM and the first auxiliary inductor LA1 (comprising LA1_1 and LA1_2) is zero, indicating a perfect isolation. As a result, an effectiveness of LM in terms of magnetic flux generation and consequently a quality factor can be preserved despite the existence of the first auxiliary inductor LA1 (comprising LA1_1 and LA1_2) and the second auxiliary inductor LA2 (comprising LA2_1 and LA2_2). Moreover, there is a very strong mutual coupling between LA1_1 and LA2_1, and also a very strong mutual coupling between LA1_2 and LA2_2, due to the proximity in layout. The current flows from $V_{DD}$ to NS2 through LA2_1 and the current flows from NS1 to $V_{SS}$ through LA1_1 will increase the magnetic flux linkage for one another due to the strong mutual coupling. Likewise, the current flows from $V_{DD}$ to NS2 through LA2_2 and the current flows from NS1 to $V_{SS}$ through LA1_2 will increase the magnetic flux linkage for one another due to the strong mutual coupling. As a result, a quality factor of the first auxiliary inductor LA1 (comprising LA1_1 and LA1_2) and the second auxiliary inductor LA2 (comprising LA2_1 and LA2_2) is enhanced, and the source degeneration and noise suppression of SDN1 and SDN2 can be more effective. Therefore, phase noise of the LC oscillator 200 can be low despite a compact layout.

Although LM in FIG. 2B is shown to be of a single turn topology, this is just a non-limiting example. In an embodiment not shown in figure but clear to those of ordinary skill in the art, the main inductor LM is of a multi-turn topology with at least one turn of metal trace laid out on the UTM layer. UTM layer is favorable for laying out the main inductor LM due to low resistance. In an embodiment, the first auxiliary inductor LA1 (comprising LA1_1 and LA1_2) is of a multi-turn topology with at least one turn of metal trace laid out on one of the UTM layer and the RDL. In an embodiment, the second auxiliary inductor LA2 (comprising LA2_1 and LA2_2) is of a multi-turn topology with at least one turn of metal trace laid out on one of the UTM layer and the RDL. The RDL has larger resistance than the UTM layer; however, by using a combination of RDL and UTM layer, an overall layout area can be more compact.

Figure 3:
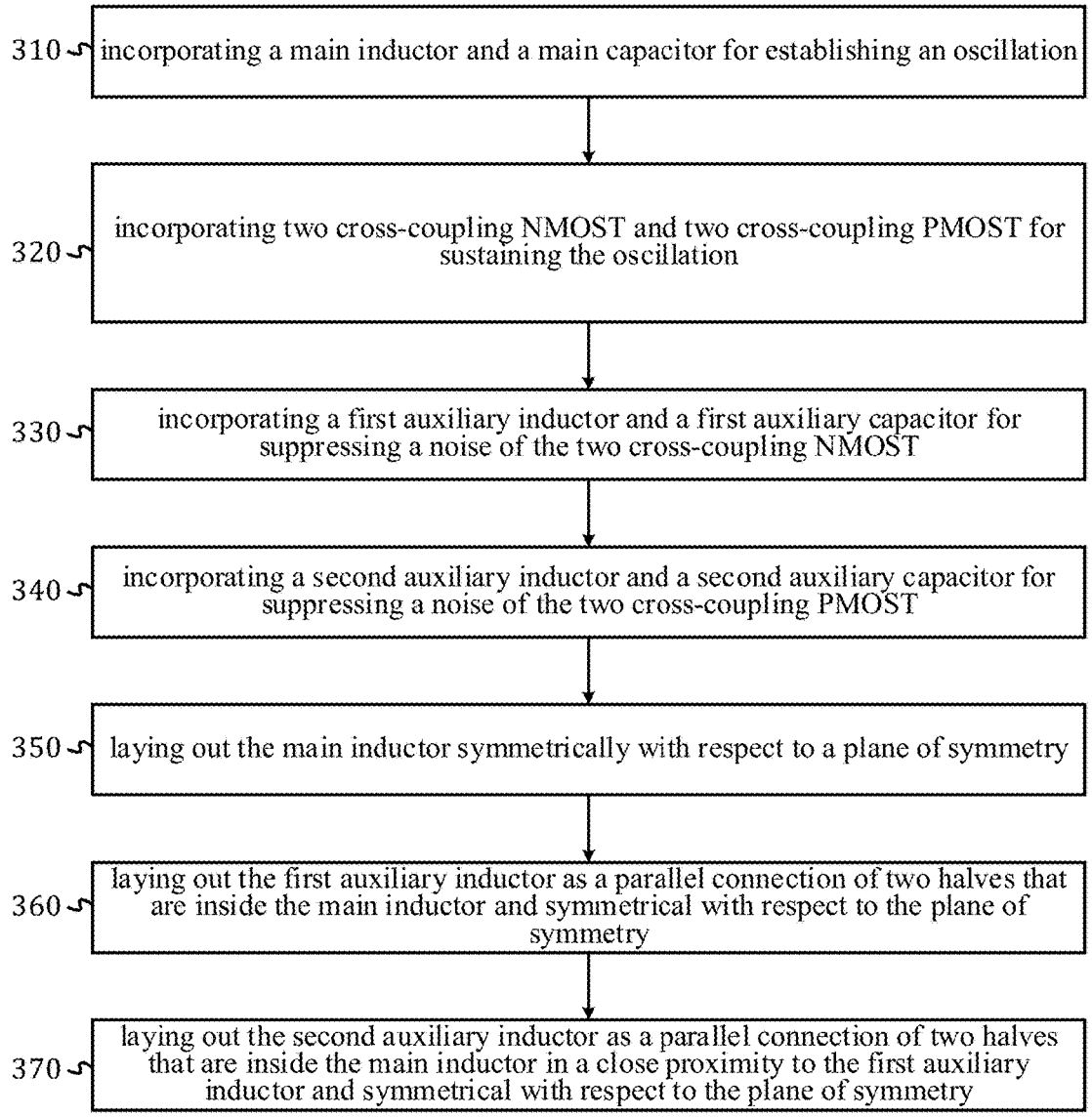
FIG. 3 shows a flow diagram of a method of integrating an oscillator in accordance with an embodiment of the present disclosure.

As illustrated by a flow diagram in FIG. 3, in accordance with an embodiment of this present invention, a method of integrating an oscillator comprises the following steps: (step 310) incorporating a main inductor and a main capacitor for establishing an oscillation; (step 320) incorporating two cross-coupling NMOST and two cross-coupling PMOST for sustaining the oscillation; (step 330) incorporating a first auxiliary inductor and a first auxiliary capacitor for suppressing a noise of the two cross-coupling NMOST; (step 340) incorporating a second auxiliary inductor and a second auxiliary capacitor for suppressing a noise of the two cross-coupling PMOST; (step 350) laying out the main inductor symmetrically with respect to a plane of symmetry; (step 360) laying out the first auxiliary inductor as a parallel connection of two halves that are inside the main inductor and symmetrical with respect to the plane of symmetry; and (step 370) laying out the second auxiliary inductor as a parallel connection of two halves that are inside the main inductor in a close proximity to the first auxiliary inductor and symmetrical with respect to the plane of symmetry.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An integrated oscillator comprising:
    a LC (inductor-capacitor) tank comprising a parallel connection of a main inductor and a main capacitor placed across a first drain node and a second drain node, the main inductor being laid out symmetrically with respect to a plane of symmetry;
    a first cross-coupling pair comprising a first NMOST (n-channel metal-oxide semiconductor transistor) and a second NMOST connected to a first source node and configured to cross couple the first drain node and the second drain node;
    a second cross-coupling pair comprising a first PMOST (p-channel metal-oxide semiconductor transistor) and a second PMOST connected to a second source node and configured to cross couple the first drain node and the second drain node;
    a first source degeneration network comprising a parallel connection of a first auxiliary capacitor and a first auxiliary inductor placed across the first source node and a ground node, the first auxiliary inductor comprising two halves that are mirror images to one another with respect to the plane of symmetry and laid out inside the main inductor, wherein the first auxiliary inductor is split into a first half of the first auxiliary inductor and a second half of the first auxiliary inductor placed across the first source node and the ground node; and
    a second source degeneration network comprising a parallel connection of a second auxiliary capacitor and a second auxiliary inductor placed across the second source node and a power supply node, the second auxiliary inductor comprising two halves that are mirror images to one another with respect to the plane of symmetry and laid out inside the main inductor, wherein the second auxiliary inductor is split into a first half of the second auxiliary inductor and a second half of the second auxiliary inductor placed across the second source node and the power supply node, wherein:
    the first auxiliary inductor and the second auxiliary inductor are laid out in a close proximity, such that there is a strong mutual coupling bertween the first half of the first auxiliary inductor and the first half of the second auxiliary inductor and also a strong mutual coupling between the second half of the first auxiliary inductor and the second half of the second auxiliary inductor.

2. The integrated oscillator of claim 1 being fabricated on a silicon substrate using a CMOS (complementary metal-oxide semiconductor) process comprising an UTM (ultra-thick metal) layer, a RDL (re-distribution layer), and a plurality of lower metal layers.

3. The integrated oscillator of claim 2, wherein the main inductor comprises a turn of metal trace laid out on the UTM layer.

4. The integrated oscillator of claim 2, wherein the first auxiliary inductor comprises a turn of metal trace laid out on one of the UTM layer and the RDL.

5. The integrated oscillator of claim 2, wherein the second auxiliary inductor comprises a turn of metal trace laid out on one of the UTM layer and the RDL.

6. The integrated oscillator of claim 1, wherein the main inductor and the main capacitor form a resonant network of a resonant frequency approximately equal to an oscillation frequency of the integrated oscillator.

7. The integrated oscillator of claim 6, wherein the first auxiliary inductor and the first auxiliary capacitor form a resonant network of a high impedance at twice of the oscillation frequency.

8. The integrated oscillator of claim 7, wherein the second auxiliary inductor and the second auxiliary capacitor form a resonant network of a high impedance at twice of the oscillation frequency.

9. A method of integrating an oscillator comprising:
    incorporating a main inductor and a main capacitor for establishing an oscillation;
    incorporating two cross-coupling NMOST (n-channel metal-oxide semiconductor transistors) and two cross-coupling PMOST (p-channel metal-oxide semiconductor transistors) for sustaining the oscillation;
    incorporating a first auxiliary inductor and a first auxiliary capacitor for suppressing a noise of the two cross-coupling NMOST;
    incorporating a second auxiliary inductor and a second auxiliary capacitor for suppressing a noise of the two cross-coupling PMOST;
    laying out the main inductor symmetrically with respect to a plane of symmetry;
    laying out the first auxiliary inductor as a parallel connection of two halves such that the first auxiliary inductor is split into a first half of the first auxiliary inductor and a second half of the first auxiliary inductor placed across a first source node and a ground node and the two halves are inside the main inductor and symmetrical with respect to the plane of symmetry; and
    laying out the second auxiliary inductor as a parallel connection of two halves such that the second auxiliary inductor is split into a first half of the second auxiliary inductor and a second half of the second auxiliary inductor placed across a second source node and a power supply node and the two halves are inside the main inductor in a close proximity to the first auxiliary inductor and symmetrical with respect to the plane of symmetry, wherein:

the first auxiliary inductor and the second auxiliary inductor are laid out in a close proximity, such that there is a strong mutual coupling bertween the first half of the first auxiliary inductor and the first half of the second auxiliary inductor and also a strong mutual coupling between the second half of the first auxiliary inductor and the second half of the second auxiliary inductor.

10. The method of integrating the oscillator of claim 9, wherein the oscillator is fabricated on a silicon substrate using a CMOS (complementary metal-oxide semiconductor) process comprising an UTM (ultra-thick metal) layer, a RDL (re-distribution layer), and a plurality of lower metal layers.

11. The method of integrating the oscillator of claim 10, wherein the main inductor comprises a turn of metal trace laid out on the UTM layer.

12. The method of integrating the oscillator of claim 10, wherein the first auxiliary inductor comprises a turn of metal trace laid out on one of the UTM layer and the RDL.

13. The method of integrating the oscillator of claim 10, wherein the second auxiliary inductor comprises a turn of metal trace laid out on one of the UTM layer and the RDL.

14. The method of integrating the oscillator of claim 9, wherein the main inductor and the main capacitor form a resonant network of a resonant frequency approximately equal to an oscillation frequency of the oscillator.

15. The method of integrating the oscillator of claim 14, wherein the first auxiliary inductor and the first auxiliary capacitor form a resonant network of a high impedance at twice of the oscillation frequency of the oscillator.

16. The method of integrating the oscillator of claim 14, wherein the second auxiliary inductor and the second auxiliary capacitor form a resonant network of a high impedance at twice of the oscillation frequency of the oscillator.

* * * * *